(12) United States Patent
Yang et al.

(10) Patent No.: US 11,615,955 B2
(45) Date of Patent: Mar. 28, 2023

(54) MATERIAL HAVING SINGLE CRYSTAL PEROVSKITE, DEVICE INCLUDING THE SAME, AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Bo-Yu Yang, New Taipei (TW); Minghwei Hong, Zhubei (TW); Jueinai Kwo, Hsinchu (TW); Yen-Hsun Lin, Changhua (TW); Keng-Yung Lin, Tainan (TW); Hsien-Wen Wan, Kaohsiung (TW); Chao Kai Cheng, New Taipei (TW); Kuan Chieh Lu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 17/001,663

(22) Filed: Aug. 24, 2020

(65) Prior Publication Data

US 2020/0388490 A1    Dec. 10, 2020

Related U.S. Application Data

(62) Division of application No. 15/487,769, filed on Apr. 14, 2017, now Pat. No. 10,755,924.

(Continued)

(51) Int. Cl.
*H01L 21/02* (2006.01)
*H01L 29/51* (2006.01)
(Continued)

(52) U.S. Cl.
CPC ...... *H01L 21/02609* (2013.01); *H01L 21/022* (2013.01); *H01L 21/0228* (2013.01);
(Continued)

(58) Field of Classification Search
CPC . H01L 29/517; H01L 29/513; H01L 27/1203; H01L 21/28194; H01L 27/12
See application file for complete search history.

(56) References Cited

U.S. PATENT DOCUMENTS 8,927,353 B2      1/2015  Hsu et al.
2005/0285175 A1*  12/2005 Cheng ............... H01L 27/10864
                                                 257/302

(Continued)

FOREIGN PATENT DOCUMENTS

CN      1453823 A      11/2003
CN    101303975 A      11/2008
CN    102683208 A       9/2012

OTHER PUBLICATIONS

S.M. Sim et al., "Phase formation in yttrium aluminum garnet powders synthesized by chemical methods", Journal of Materials Science, vol. 35, (2000), pp. 713-717.

(Continued)

*Primary Examiner* — Tony Tran
(74) *Attorney, Agent, or Firm* — McDermott Will & Emery LLP

(57) ABSTRACT

A method for forming a material having a Perovskite single crystal structure includes alternately growing, on a substrate, each of a plurality of first layers and each of a plurality of second layers having compositions different from the plurality of first layers and forming a material having a Perovskite single crystal structure by annealing the plurality of first layers and the plurality of second layers.

20 Claims, 13 Drawing Sheets

Related U.S. Application Data

(60) Provisional application No. 62/344,311, filed on Jun. 1, 2016.

(51) Int. Cl.
*H01L 21/28* (2006.01)
*H01L 29/66* (2006.01)

(52) U.S. Cl.
CPC ...... *H01L 21/0254* (2013.01); *H01L 21/0262* (2013.01); *H01L 21/02197* (2013.01); *H01L 21/02395* (2013.01); *H01L 21/02433* (2013.01); *H01L 21/02463* (2013.01); *H01L 21/02516* (2013.01); *H01L 21/02543* (2013.01); *H01L 21/02546* (2013.01); *H01L 21/02565* (2013.01); *H01L 21/02694* (2013.01); *H01L 21/28185* (2013.01); *H01L 21/28194* (2013.01); *H01L 29/513* (2013.01); *H01L 29/517* (2013.01); *H01L 29/66795* (2013.01); *Y02P 70/50* (2015.11)

(56) References Cited

U.S. PATENT DOCUMENTS

2011/0062446 A1   3/2011   Goyal
2011/0160066 A1*  6/2011   Aytug ............... C23C 14/35
                                                         505/434
2016/0027985 A1*  1/2016   Baniecki ............ H01L 35/32
                                                         136/205

OTHER PUBLICATIONS

Mark R. Levy, "Crystal Structure and Defect Property Predictions in Ceramic Materials", Imperial College of Science, Technology and Medicine, Jan. 2005, pp. 1-242.

Non-Final Office Action issued in U.S. Appl. No. 15/487,769, dated Apr. 18, 2018.

Non-Final Office Action issued in U.S. Appl. No. 15/487,769, dated Aug. 30, 2018.

Non-Final Office Action issued in U.S. Appl. No. 15/487,769, dated Jul. 11, 2019.

Final Office Action issued in U.S. Appl. No. 15/487,769, dated Feb. 8, 2019.

Final Office Action issued in U.S. Appl. No. 15/487,769, dated Dec. 19, 2019.

Notice of Allowance issued in U.S. Appl. No. 15/487,769, dated Apr. 17, 2020.

* cited by examiner

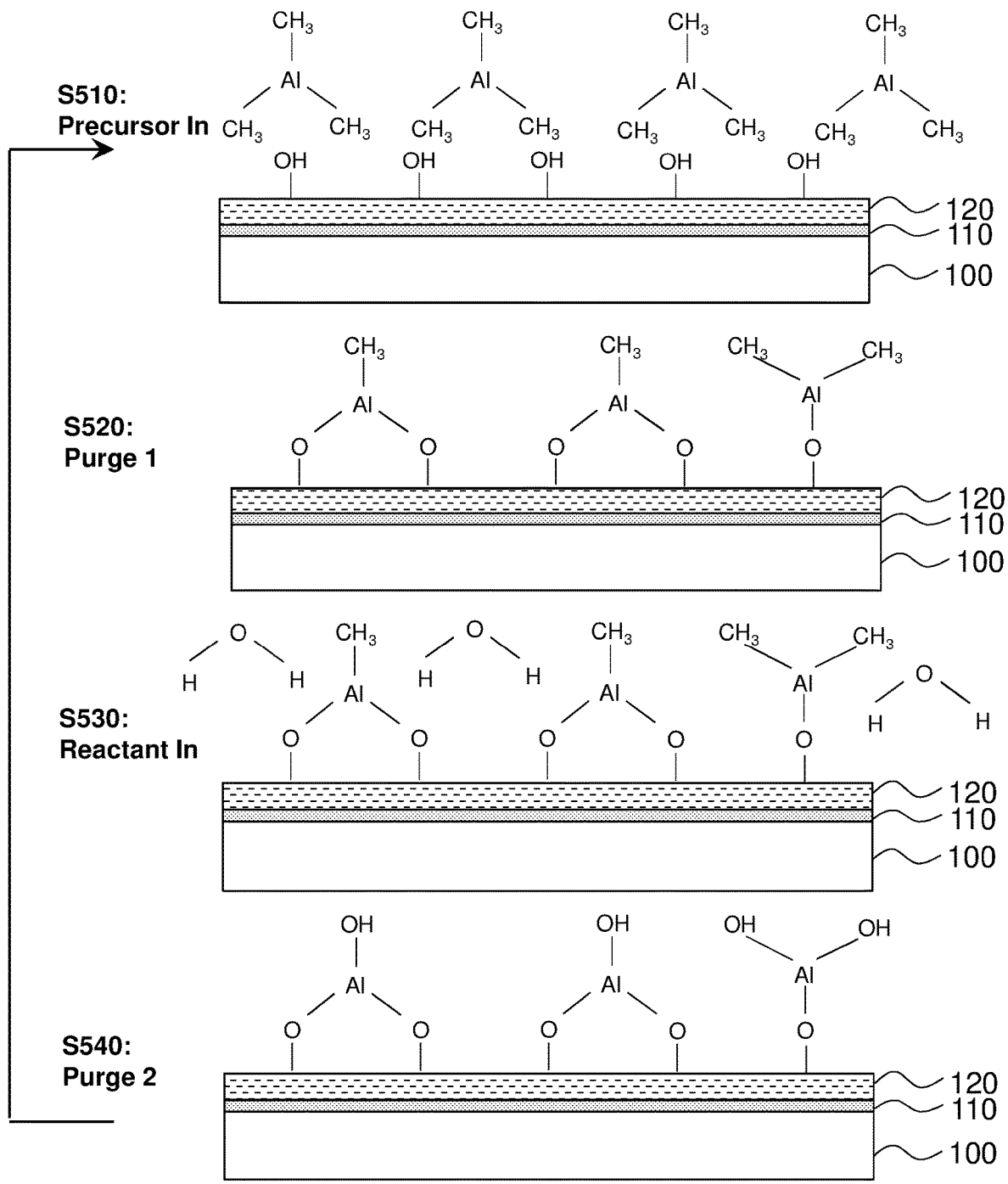

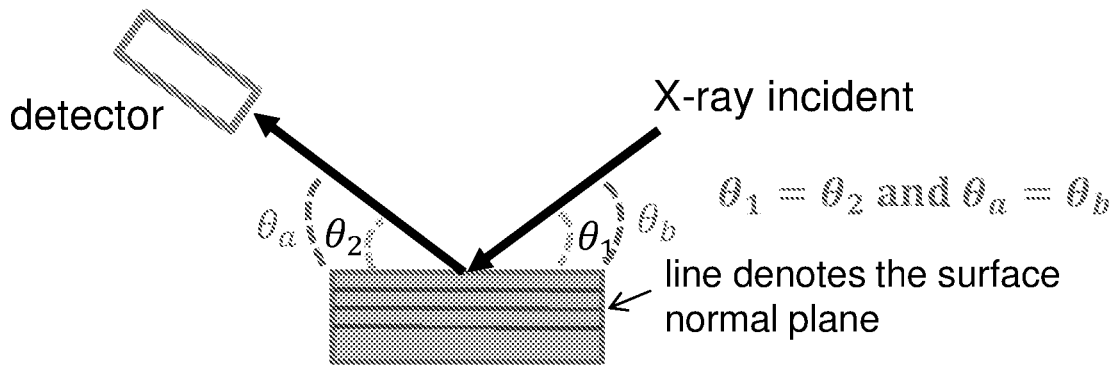

Normal scan to see diffraction peaks along surface normal direction
$\theta_a$ is the angle between incident X-ray and normal plane
$\theta_b$ is the angle between detector and normal plane
$\theta_1$ is the angle between incident X-ray and surface normal plane
$\theta_2$ is the angle between detector and surface normal plane

FIG. 11A

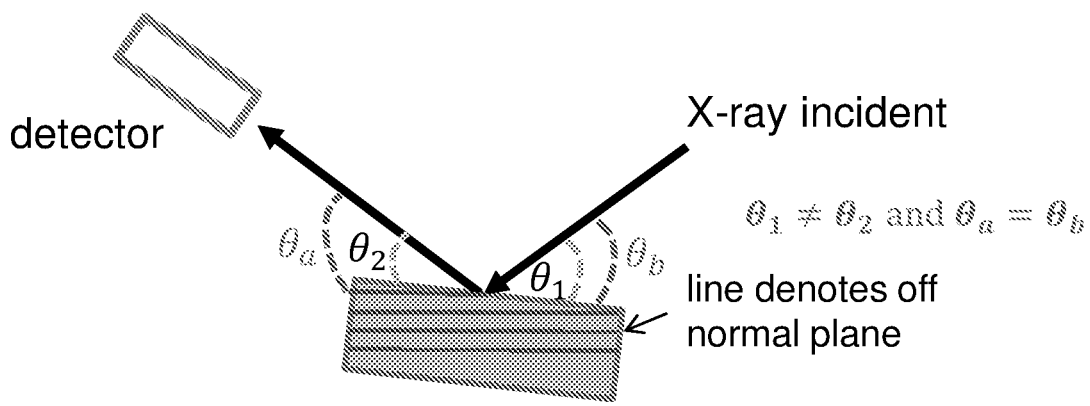

Rotate the sample such that $\theta_a = \theta_b$
$\theta_a$ is the angle between incident X-ray and off normal plane
$\theta_b$ is the angle between detector and off normal plane
$\theta_1$ is the angle between incident X-ray and surface normal plane
$\theta_2$ is the angle between detector and surface normal plane

MATERIAL HAVING SINGLE CRYSTAL PEROVSKITE, DEVICE INCLUDING THE SAME, AND MANUFACTURING METHOD THEREOF

PRIORITY CLAIM AND CROSS-REFERENCE

This application is a divisional application of U.S. patent application Ser. No. 15/487,769, filed Apr. 14, 2017, which claims priority to U.S. Provisional Application No. 62/344,311 filed Jun. 1, 2016, entitled "SINGLE CRYSTAL PEROVSKITE MANUFACTURED BY ATOMIC LAYER DEPOSITION WITH POST-DEPOSITION ANNEALING AND DEVICES INCLUDING THE SAME," the entire disclosures of each of which are incorporated herein by reference.

TECHNICAL FIELD

The present disclosure is related to a material having single crystal Perovskite, a manufacturing method thereof, and a device including the same.

BACKGROUND

Materials having a Perovskite-related structure exhibit technologically important properties, including ferroic, high dielectric constant, superconducting, and optical properties. Examples of Perovskite structures include cubic Perovskite, orthorhombic Perovskite, rhombohedral Perovskite, and hexagonal Perovskite. Materials having a Perovskite structure have drawn a lot of attention from industrial and academic fields to manufacture photovoltaic devices. For example, due to long carrier diffusion lengths of >175 µm, the efficiency of Perovskite-based solar cells can reach 31%, making them a promising candidate in photovoltaic applications. Currently, organic and inorganic Perovskite materials are made with a lower cost method such as spin coating. Poor crystallinity including the grain boundary and the defects, and interface between a Perovskite structure and a substrate on which Perovskite structure is formed, can cause carriers (electrons and holes) scattering, thus deteriorating the performance of photovoltaic devices. Recently, materials having a Perovskite structure, manufactured by Czochralski method or powder sintering, have been used in microelectronic applications. Czochralski method, however, usually requires a very high growth temperature and is limited to a very small area, and thus Czochralski method is incompatible to integrally form a material having a Perovskite structure on a commercially available substrate which usually has a large size and which cannot be sustained at a very high temperature. Powder sintering usually forms polycrystalline and inevitably reduces the desired properties comparing to a material having a Perovskite-type single crystal. That is, inferior interface quality and stability of the existing Perovskite materials and the contemporary methods thereof may not fulfill the requirements of modern electronic devices and new generation of electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a cross-sectional view illustrating a method for manufacturing a structure having a Perovskite-type single crystal according to embodiments of the present disclosure.

FIG. 5 is a cross-sectional view illustrating a method for manufacturing a structure having a Perovskite-type single crystal according to embodiments of the present disclosure.

FIGS. 11A and 11B illustrate concepts of a normal scan by X-ray diffraction (XRD) and an off-normal scan by XRD, respectively.

DETAILED DESCRIPTION

Figure 1:
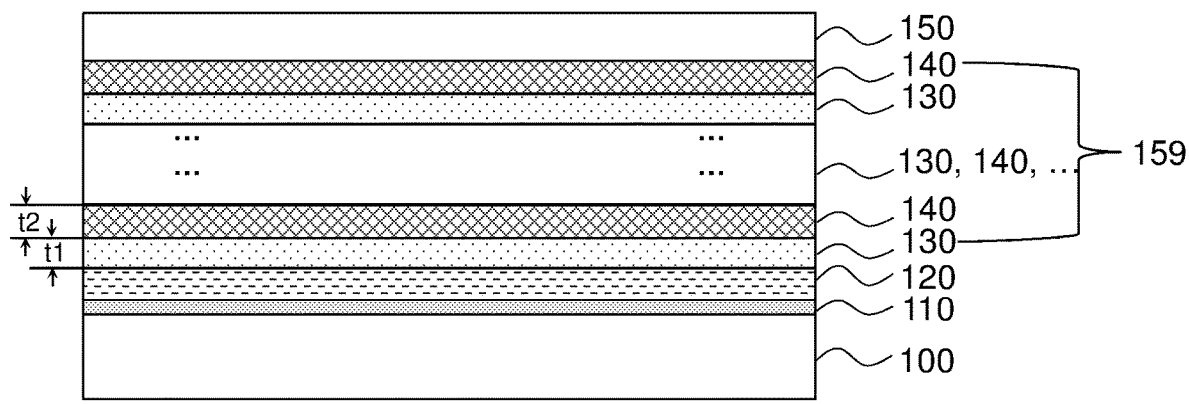
FIG. 1 schematically illustrates a cross-sectional view of a multilayer structure for forming a Perovskite-type single crystal according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the entire disclosure, "about" or "approximately" used to describe a parameter means that design error/margin, manufacturing error/margin, measurement error etc. are considered to define the parameter. Such a description should be recognizable to one of ordinary skill in the art.

Figure 2:
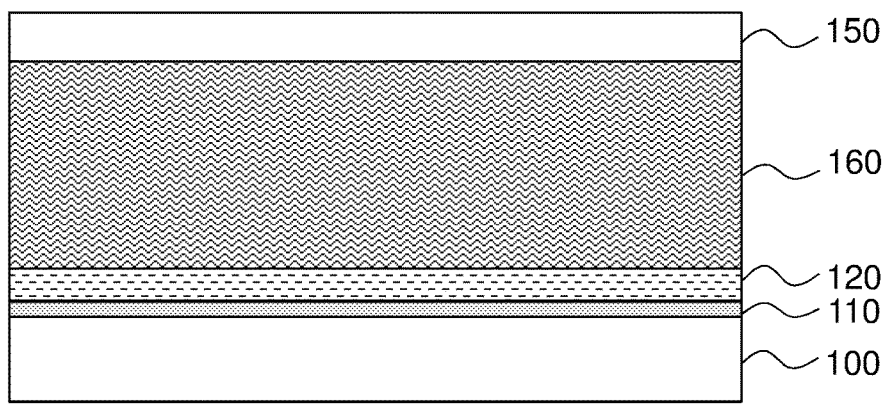
FIG. 2 schematically illustrates a cross-sectional view of a structure having a Perovskite-type single crystal according to embodiments of the present disclosure.

FIG. 1 schematically illustrates a cross-sectional view of a multilayer structure for forming a Perovskite-type single crystal according to embodiments of the present disclosure, and FIG. 2 schematically illustrates a cross-sectional view of a structure having a Perovskite-type single crystal according to embodiments of the present disclosure.

Referring to FIGS. 1 and 2, a structure 160 having a Perovskite-type single crystal as shown in FIG. 2 is formed from a stacked multilayer structure 159 including a plurality of first layers 130 and a plurality of second layers 140 alternately stacked on a substrate 100 as shown in FIG. 1.

The substrate 100 can be a Group III-V compound semiconductor including AlN, AlP, AlAs, AlSb, AlBi, GaN, GaP, GaAs, GaSb, GaBi, InN, InP, InAs, InSb, InBi, $Al_xGa_{1-x}As$ (0<x<1), or $In_yGa_{1-y}As$ (0<y<1). In other embodiments, the substrate may be a Group II-VI or a Group IV semiconductor such as Si and Ge. Alternatively, the substrate 100 may be a Perovskite material such as $LaAlO_3$ and $SrTiO_3$. A surface of the substrate 100 on which the structure 160 having a Perovskite-type single crystal is formed can be a flat surface obtained by, for example, chemical mechanical polishing (CMP), or can have patterned structures such as steps formed thereon or have any intentionally formed or unintentionally formed textures. In some embodiments, each of the plurality of first layers 130 and the plurality of second layers 140 of the structure 160 having a Perovskite-type single crystal may extend across an entire deposition surface of the substrate 100, although the present disclosure is not limited thereto.

In some embodiments, materials constituting the structure 160 including a Perovskite-type single crystal can have a chemical formula $ABX_3$. A is a rare earth element including one or more of Sc, Y, La, Ce, Pr, Nd, Pm, Sm, Eu, Gd, Tb, Dy, Ho, Er, Tm, Yb, and Lu, or A is an alkaline earth element including one or more of Be, Mg, Ca, Sr, and Ba, or A is organic compound $CH_3NH_3$. B is a non-rare earth element including one or more of Ti, Zr, Hf, Al, Ga, In, Tl, Ge, Sn, and Pb, or B is a rare-earth element or a transition metal. X is nonmetal elements including one or more of O, S, Se, Te, F, Cl, Br, I, and At.

According to some embodiments, each of the first layers 130 and the second layers 140 can be a metal oxide layer. For example, the first layer 130 can be an $Al_2O_3$ layer formed by a self-limiting reaction deposition method such as, but not limited to, atomic layer deposition (ALD), molecular beam deposition (MBD), and molecular layer deposition (MLD), and the second layer 140 can be a $Y_2O_3$ layer formed by a self-limiting reaction deposition method such as, but not limited to, ALD, MBD, and MLD. According to other embodiments, the first layer 130 can be a $Y_2O_3$ layer and the second layer 140 can be an $Al_2O_3$ layer.

According to some embodiments, a structure including a single layer of the plurality of first layers 130 or a single layer of the plurality of second layers 140 may not have a Perovskite structure; however, a structure of two or more annealed layers of the alternately stacked first and second layers 130 and 140 can have a Perovskite structure. These features will be more apparent with reference to FIGS. 3-12E to be described later.

Although as illustrated in FIGS. 1 and 2, the structure 160 having a Perovskite-type single crystal is formed of three or more pairs of the first layer 130 and the second layer 140 which are alternately stacked on the substrate 100, the present disclosure should not be limited thereto. According to some embodiments, the structure 160 having a Perovskite-type single crystal may be formed of only one pair of the first layer 130 and the second layer 140, one pair of the first layer 130 and the second layer 140 with an additional first layer 130, two pairs of the first layer 130 and the second layer 140, or two pairs of the first layer 130 and the second layer 140 with an additional first layer 130.

In some embodiments, each of the plurality of first layers 130 and the plurality of second layers 140 has a thickness in a range from about 0.2 nm to about 0.2 μm, and the total thickness of the stacked first and second layers 130 and 140 has a range from about 0.5 nm to about 10 μm. In some embodiments, the total thickness of the stacked first and second layers 130 and 140 can be from about 10 nm to about 20 nm and each of the stacked first and second layers 130 and 140 can be in a range from about 1 nm to about 2 nm, dependent on applications of the structure 160 having a Perovskite-type single crystal.

According to some embodiments, a distribution in a thickness direction of the alternately stacked first and second layers 130 and 140 layers (i.e., a stacking direction of the first and second layers 130 and 140) can be uniform or non-uniform, allowing a ratio of compositions constituting the first and second layers 130 and 140 to be a function of a thickness thereof.

For example, a ratio of a first thickness t1 of the first layer 130 to a second thickness t2 of the second layer 140 satisfies a criterion determined by respective materials constituting the first and second layers 130 and 140. According to some embodiments, the ratio of the first thickness t1 to the second thickness t2 is substantially constant. In this disclosure, "substantially constant" means a complete constant with some margins/errors, which may be within ±5% of the constant.

In order to form a stoichiometric single crystal structure 160, the first thickness t1 of the first layer 130 and the second thickness t2 of the second layer 140 (or a ratio of t1 to t2) satisfy the following Equation 1:

$$\frac{t1 \times A \times \rho1}{M1} : \frac{t2 \times A \times \rho2}{M2} = 1:1 \qquad \text{Equation 1}$$

where A is a deposition area, $\rho1$ and $\rho2$ are densities of the first and second layers 130 and 140, respectively, and M1 and M2 are molar masses of materials constituting the first and second layers 130 and 140, respectively.

In a case in which the first layer 130 is an $Al_2O_3$ and the second layer 140 is a $Y_2O_3$ layer, $\rho1$ and $\rho2$ are about 4 g/cm$^3$ and about 5 g/cm$^3$, respectively, and M1 and M2 are about 101.96 g/mol and about 225.81 g/mol, respectively. Based on Equation 1, the ratio of the first thickness t1 to the second thickness t2 can be determined to be about 1:1.77.

Still referring to FIGS. 1 and 2, a first barrier layer 110 can be optionally formed prior to forming the plurality of first layers 130 and the plurality of second layers 140. The first barrier layer 110 can be formed, for example, by molecular beam epitaxy (MBE) or metal-organic chemical vapor deposition (MOCVD). By forming the first barrier layer 110, a surface having more suitable conditions including better lattice matching and fewer defects than that of the substrate 100 can be provided so as to promote subsequent formation of the first and second layers 130 and 140 through a self-limiting reaction deposition method, such as ALD and MBD. In a case in which the substrate 100 is an n-GaAs (111)A substrate, the first barrier layer 110 can be a GaAs (111)A-2×2 epitaxial layer having a thickness from about 0.3 nm to about 300 nm, for example, about 2 nm, formed by, for example, MBE. If the thickness of the first barrier layer 110 is less than 0.3 nm, the first barrier layer 110 may still have a certain degree of lattice matching and a large number of defects, unsuitable for the subsequent processes. On the other hand, if the thickness of the first barrier layer 110 is greater than about 300 nm, the processing time to form the first barrier layer 110 may be too long.

According to some embodiments, a second barrier layer 120 can be formed, by self-limiting reaction deposition method such as ALD and MBD, between the first barrier layer 110 and the stacked structure of the plurality of first layers 130 and the plurality of second layers 140. The second barrier layer 120 may have the same composition as that of the second layer 140 in some embodiments. For example, in a case in which the second layer 140 is a $Y_2O_3$ layer, the second barrier layer 120 is also a $Y_2O_3$ layer, although the thicknesses of the second barrier layer 120 can be the same as or different from the second layer 140. By forming the second barrier layer 120, the first layer 130, if formed of $Al_2O_3$, is not in direct contact with any other layers except $Y_2O_3$ layers. Since the second barrier layer 120 can effectively passivate the substrate and/or the previously formed layers such as the first barrier layer 110, an interfacial trap density can be reduced. As an example, $Y_2O_3$ can effectively passivate the GaAs surface, and thus, $Y_2O_3$ is used for the second barrier layer 120 prior to the subsequent processes in order to lower the interfacial trap density between the subsequently formed multilayer structure and the n-GaAs (111)A substrate 100. The thickness of the second barrier layer 120 formed of $Y_2O_3$ and the thickness of the first layer 130 immediately adjacent to the second barrier layer 120 may, or may not, satisfy the ratio defined in Equation 1. According to some embodiments, the thickness of the second barrier layer 120 is less than the second thickness t2 of the second layer 140 even when both layers are formed of the same material and/or by the same method. In some embodiments, the first barrier layer 110 can be omitted, and in this case, the second barrier layer can be directly formed on the substrate 100.

Referring still to FIGS. 1 and 2, a protection layer 150, formed of the same material as the first layer 130, for example, $HfO_2$, or any other suitable materials which can prevent an outmost second layer 140 from direct exposure to air, can be optionally disposed on an uppermost layer of the plurality of first layers 130 and the plurality of second layers 140. The protection layer 150 can be formed by a self-limiting reaction deposition method such as ALD and MBD, following the formation of the plurality of first layers 130 and the plurality of second layers 140. Thus, deterioration due to absorbing moisture from air by the second layer 140 can be prevented, even if the second layer 140 is formed of $Y_2O_3$ which has relatively higher moisture absorption than that of $Al_2O_3$ and $HfO_2$. The thickness of the protection layer 150, if formed of $Al_2O_3$, and the thickness of the second layer 140 immediately adjacent to the protection layer 150 may, or may not, satisfy the relationship required by Equation 1. According to some embodiments, the thickness of the protection layer 150 is greater than the first thickness t1 of the first layer 130 even when both layers are formed of the same material and/or by the same method.

A boundary between immediately adjacent layers such as the outmost second layer 140 and the protection layer 150 or a boundary between immediately adjacent layers such as the outmost first layer 130 and the second barrier layer 120 may be shifted after annealing, in a case in which the protection layer 150 is formed of the same material constituting the first layer 130 and the second barrier layer 120 is formed of the same material constituting the second layer 140, since some portion of the protection layer 150 and some portion of the second barrier layer 120 may participate in the formation of the structure 160 including a Perovskite-type single crystal in the annealing process.

Figure 3:
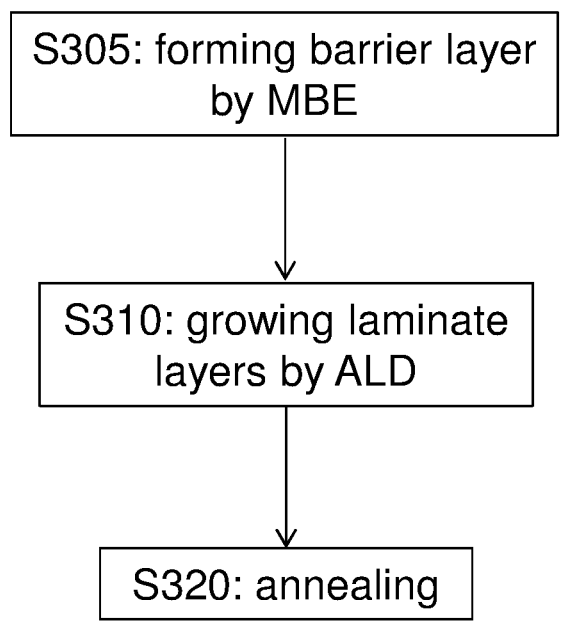
FIG. 3 illustrates a flowchart of a method for manufacturing a structure having a Perovskite-type single crystal according to embodiments of the present disclosure.

FIG. 3 illustrates a flowchart of a method for manufacturing a structure having a Perovskite-type single crystal according to embodiments of the present disclosure.

According to some embodiments, in Step S305, a first barrier layer 110 (shown in FIG. 4) is formed on a substrate 100 (shown in FIG. 4) inside an MBE chamber by MBE. The substrate 100 can be one of the aforementioned substrates and will not be repeatedly described here to avoid redundancy. In Step S310, a plurality of laminate layers including a second barrier layer 120 (see FIG. 4), alternately stacked first and second layers 130 and 140 (see FIGS. 5-8), and a protection layer 150 (see FIG. 9) are formed in, for example, an atomic layer deposition (ALD) chamber by ALD. According to some embodiments, Step S305 can be omitted and in this case, the substrate 100 is directly loaded into the ALD chamber. In some embodiments, the protection layer 150 can be alternatively formed inside the MBE chamber by MBE after forming the alternately stacked first and second layers 130 and 140 inside the ALD chamber by ALD. Thereafter, in Step S320, the formed layers together with the substrate 100 are annealed in an annealing chamber/further so as to form a structure having a Perovskite-type single crystal. In some embodiments, the temperature for forming a structure having a Perovskite-type single crystal can be very low, and thus no additional annealing is needed when the growth temperature for forming the aforementioned multilayers reach the formation temperature. In this case, Step S320 can be omitted. In the following, Steps S310 and S320 will be described in detail with reference to FIGS. 4-10.

FIGS. 4-10 are cross-sectional views illustrating a method for manufacturing a structure having a Perovskite-type single crystal according to embodiments of the present disclosure.

For convenience, the method with reference to FIGS. 4-10 will be described to form YAlO$_3$ having a Perovskite structure by forming one or more pairs of Al$_2$O$_3$ and Y$_2$O$_3$ layers by ALD followed by an annealing process as an example, although the present disclosure is not limited thereto.

As shown in FIG. 4, a first barrier layer 110 is formed on a substrate 100 by MBE. In a case in which the substrate 100 is an n-GaAs(111)A substrate and a layer having Perovskite structure is a YAlO$_3$ layer to be formed, the first barrier layer 110 can be a GaAs(111)A-2×2 epitaxial layer having a thickness from about 0.3 nm to about 300 nm, for example, about 1 to 5 nm, or about 2 nm.

Subsequently and/or optionally, a second barrier layer 120 such as a Y$_2$O$_3$ layer is formed by ALD onto the first barrier layer 110. According to some embodiments, the additional Y$_2$O$_3$ having a thickness, for example, about 1 nm, can minimize impacts from the substrate 100 and/or the first barrier layer 110 to the alternately stacked first and second layers 130 and 140 to be formed subsequently.

Thereafter, the upper surface of the second barrier layer 120 is treated to have —OH groups by supplying for example, water vapor, into the ALD chamber. One of ordinary skill should appreciate that showing —OH groups in FIG. 4 is merely for convenience of illustration and that preparing the exterior surface of the second barrier layer 120 to have —OH groups can be a part of the processes shown in FIG. 5. Alternatively, the preparation of the exterior surface of the second barrier layer 120 to have —OH groups can be omitted, if trimethylaluminium (TMA) molecules, an exemplary precursor for forming Al$_2$O$_3$ by ALD, can adhere to the surface of the second barrier layer 120. In some embodiments, instead of preparing the exterior surface of the second barrier layer 120 to have —OH groups, oxygen rich surface may be formed when oxygen or ozone instead of water vapor is supplied into the ALD chamber.

Referring now to FIG. 5, after processing pressure and deposition temperature have been established to be, for example, from about 3 Torr to about 10 Torr and from about 200° C. to about 350° C., respectively, a carrier gas selected from a set of inert gases including Ar, He, or N$_2$ is introduced into the ALD chamber. Thereafter, a precursor such as TMA is flowed into the ALD chamber together with the carrier gas to produce a monolayer containing alumina on the second barrier layer 120 (S510 and S520).

Subsequently, the flow of the precursor TMA terminates. Meanwhile, the flow of the carrier gas continues, purging the ALD chamber so as to remove the remaining TMA and by-products generated during formation of the monolayer containing alumina (S520).

Thereafter, a flow of an oxygen-containing reactant such as water vapor, oxygen, or ozone is introduced into the ALD chamber. Thus, —CH$_3$ present on the monolayer containing alumina reacts with the reactant so that oxygen is chemisorbed into the monolayer containing alumina to form an Al$_2$O$_3$ monolayer (S530).

Next, the flow of the oxygen-containing reactant is terminated. Meanwhile, the flow of the carrier gas resumes, purging the ALD chamber so as to remove the remaining oxygen-containing reactant and by-products generated during formation of the Al$_2$O$_3$ monolayer (S540).

Figure 6:
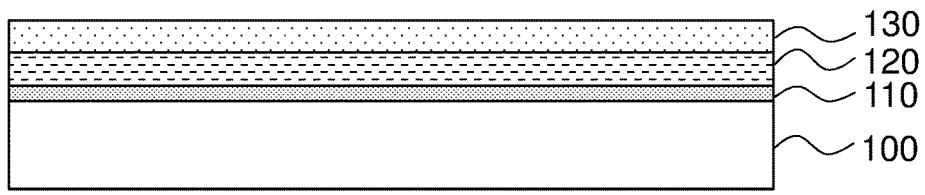
FIG. 6 is a cross-sectional view illustrating a method for manufacturing a structure having a Perovskite-type single crystal according to embodiments of the present disclosure.
Figure 7:
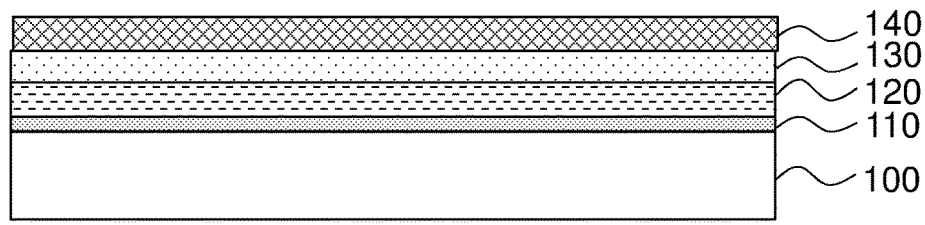
FIG. 7 is a cross-sectional view illustrating a method for manufacturing a structure having a Perovskite-type single crystal according to embodiments of the present disclosure.

The aforementioned steps S510 through S540 may be repeated multiple times until a plurality of Al$_2$O$_3$ monolayers reaches a desired thickness to correspond to the first layer 130 shown in FIG. 6.

The second layer 140 formed of Y$_2$O$_3$ can be grown following steps S510 through S540 with other suitable precursor and reactant such as Y(EtCp)$_3$, (iPrCp)$_2$Y(iPr-amd), Y(iPrCp)$_3$, Y(Cp)$_3$, and Y(MeCp)$_3$, although the present disclosure is not limited thereto. The thickness of the second layer 140, i.e., cycles required to repeatedly form a plurality of monolayers of Y$_2$O$_3$ constituting the second layer 140, can be determined based on Equation 1 when the thickness of the first layer 130 or cycles to forming the plurality of Al$_2$O$_3$ monolayers constituting the first layer 130 are determined. To avoid redundancy, the steps for forming the second layer 140 shown in FIG. 7 will not be elaborated.

It should be appreciated that forming the second barrier layer 120, if by ALD, can also be referred to steps S510 through S540 with other suitable precursor and reactant.

Figure 8:
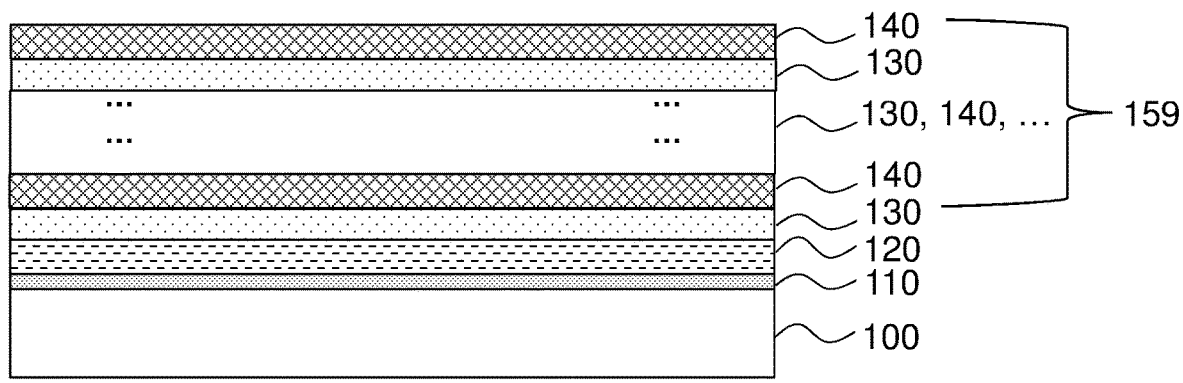
FIG. 8 is a cross-sectional view illustrating a method for manufacturing a structure having a Perovskite-type single crystal according to embodiments of the present disclosure.

Referring to FIG. 8, additional first and second layers 130 and 140 can be alternately formed according to the aforementioned steps so as to form a multilayer structure 159. The number of stacked pairs of Al$_2$O$_3$ and Y$_2$O$_3$ layers constituting the multilayer structure 159 can be determined in consideration of the requirement of the ultimate thickness of YAlO$_3$ having Perovskite structure and the thickness of individual Al$_2$O$_3$ and Y$_2$O$_3$ layers.

Figure 9:
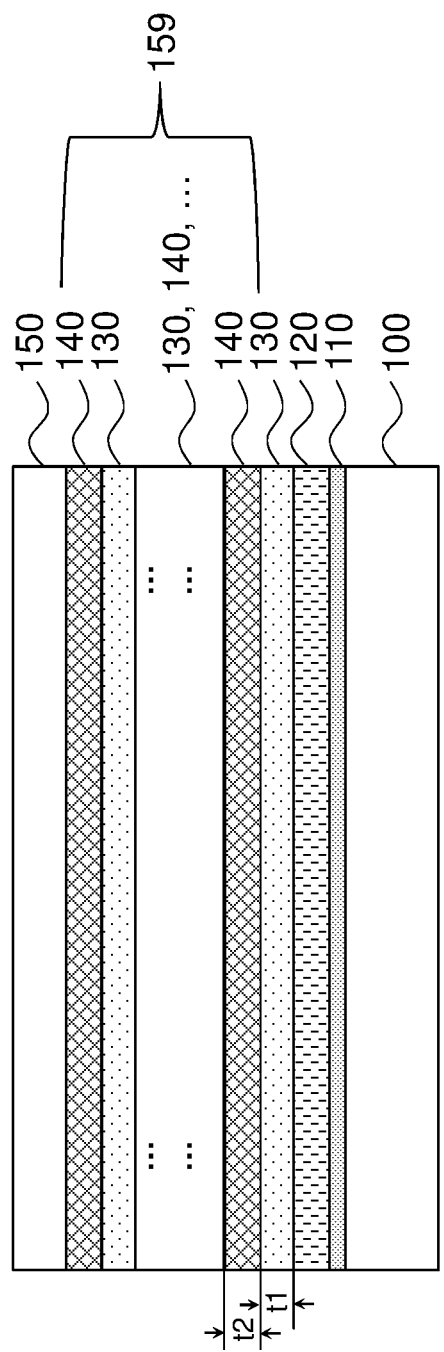
FIG. 9 is a cross-sectional view illustrating a method for manufacturing a structure having a Perovskite-type single crystal according to embodiments of the present disclosure.

Thereafter, as shown in FIG. 9, a protection layer 150 can be optionally formed to protect the plurality of first and second layers 130 and 140. The protection layer 150 can be formed by ALD, MBE, MLD, or any other suitable process. According to some embodiments, the protection layer 150 is an additional Al$_2$O$_3$ layer, such that moisture cannot directly contact the outmost Y$_2$O$_3$ layer.

Figure 10:
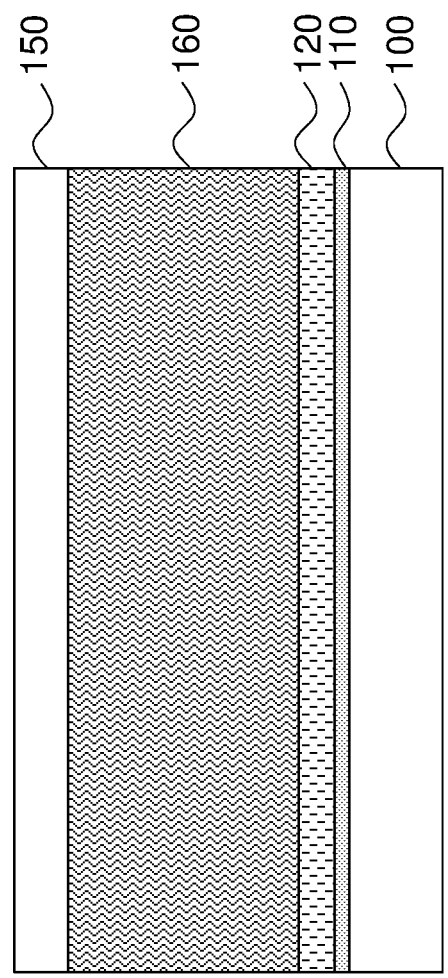
FIG. 10 is cross-sectional views illustrating a method for manufacturing a structure having a Perovskite-type single crystal according to embodiments of the present disclosure.

Now referring to FIG. 10, the substrate 100, together with the laminate layers including the first and second barrier layers 110 and 120, the multilayer structure 159 having the alternately stacked first and second layers 130 and 140, and the protection layer 150, is annealed at an annealing temperature, for example, about 300° C. to about 900° C. for about 2 seconds to about 10 hours in an annealing chamber. The annealing temperature can be increased from room temperature at a rate, for example, about 50° C./second. According to some embodiments, the annealing process to form YAlO$_3$ having a Perovskite-type single crystal can be performed from about 850° C. to about 950° C. for about 2 seconds to about 90 seconds. According to some embodiments, when the target crystal is SrTiO$_3$ having a Perovskite-type single crystal, the annealing process can be performed from about 450° C. to about 600° C. for about 10 minutes to about 1.5 hours. According to some embodiments, the annealing process to form SrTiO$_3$ having a Perovskite structure can be performed a higher temperature, for example, at about 900° C. for a shorter time, for example, about 4 minutes to about 10 minutes. According to some embodiments, when the target crystal is BaTiO$_3$ having a Perovskite-type single crystal, the annealing process can be performed from about 450° C. to about 600° C. for about 10 minutes to about 1.5 hours. The annealing can be performed by an annealing chamber or furnace. Alternatively, the annealing can be performed by laser annealing. The annealing process can be carried out in air, or gases with low reactivity such as N$_2$, He, and Ar, or a highly reactive gas such as O$_2$ and ozone.

The thickness of individual Al$_2$O$_3$ and/or Y$_2$O$_3$ layer before annealing can be from about 0.3 nm to about 0.5 nm up to about 10 nm or about 20 nm. As described above, the thickness of the first layer 130 and the thickness of the second layer 140 immediately adjacent thereto meet Equation 1. As an example, the ratio of thickness of $Y_2O_3$ and the thickness of $Al_2O_3$ can be about 1.77, although the disclosure is not limited thereto when design, manufacturing, or measurement errors/margins are considered.

After annealing, the alternately stacked first and second layers 130 and 140 are converted to a $YAlO_3$ layer 160 having Perovskite structure.

One of ordinary skill in the art shall appreciate that a boundary between the protection layer 150 and the second layer 140 immediately adjacent thereto and/or a boundary between the second barrier layer 120 and the first layer 130 immediately adjacent thereto may be shifted (or disappear) after annealing in a case in which the protection layer 150 and the second barrier layer 120 are formed of $Y_2O_3$ and $Al_2O_3$ by ALD, respectively, since some portion of the protection layer 150 and some portion of the second barrier layer 120 may be consumed in the formation of the multilayer structure 160 having a Perovskite-type single crystal in the annealing process.

The structure 160 including the plurality of first layers 130 and the plurality of second layers 140 manufactured according to the aforementioned method can be confirmed to be Perovskite-type single crystal by X-ray diffraction (XRD).

Figure 12A:
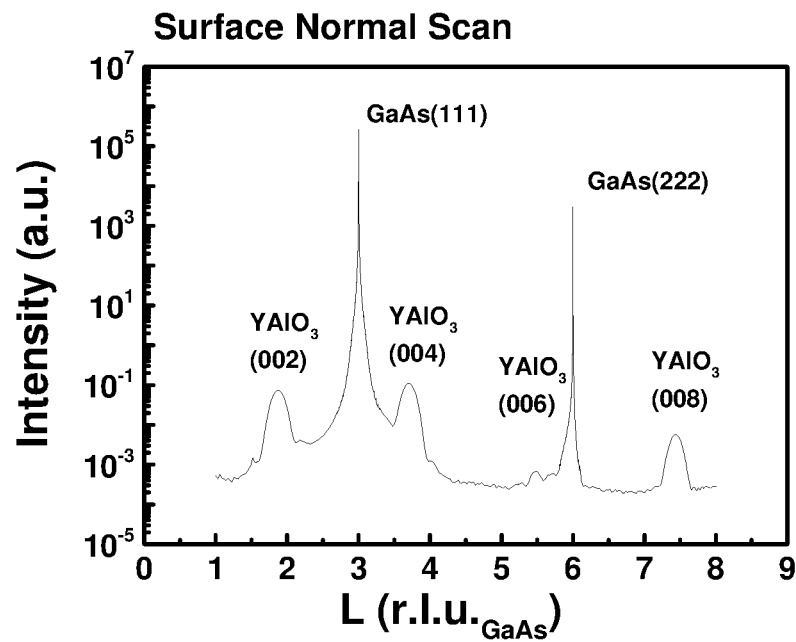
FIG. 12A illustrates characteristics of an annealed structure of $YAlO_3$ through a normal scan by XRD.
Figure 12B:
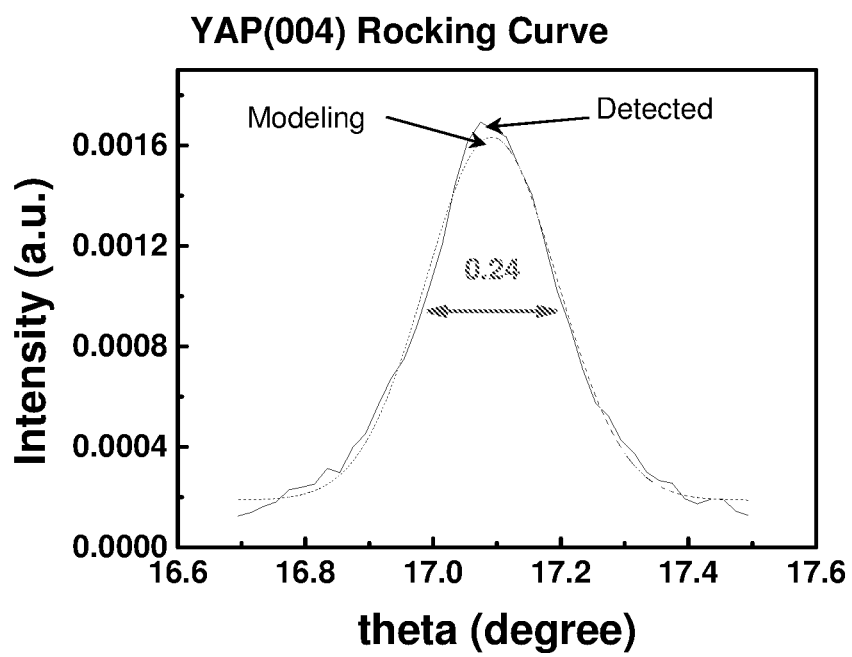
FIG. 12B illustrates a rocking curve across $YAlO_3(004)$ reflection.
Figure 12C:
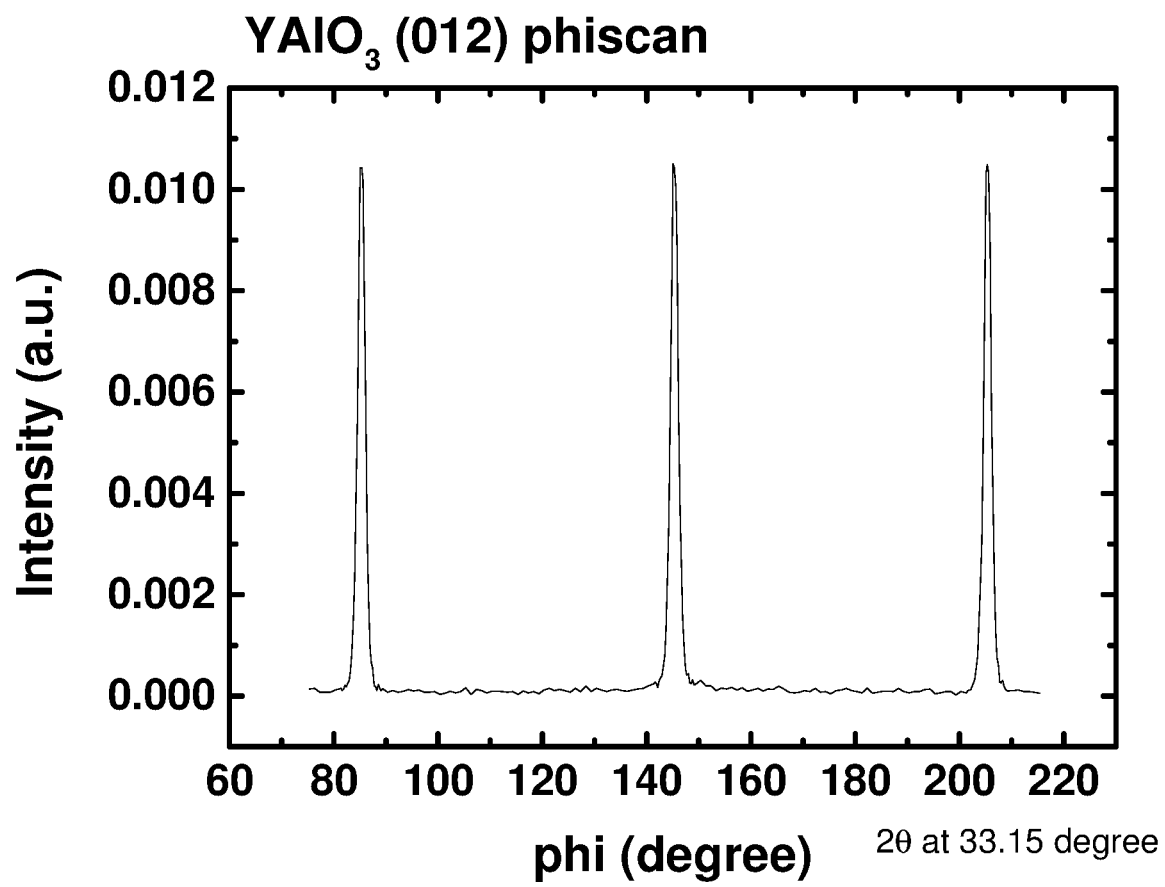
FIG. 12C illustrates a φ-scan across $YAlO_3(012)$ reflection.
Figure 12D:
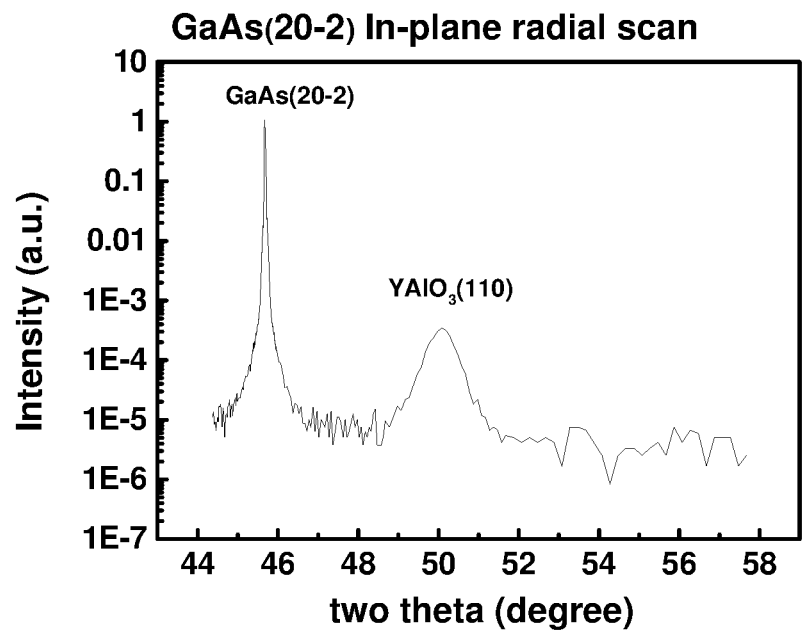
FIG. 12D illustrates $GaAs(20-2)$ in plane radial scan.
Figure 12E:
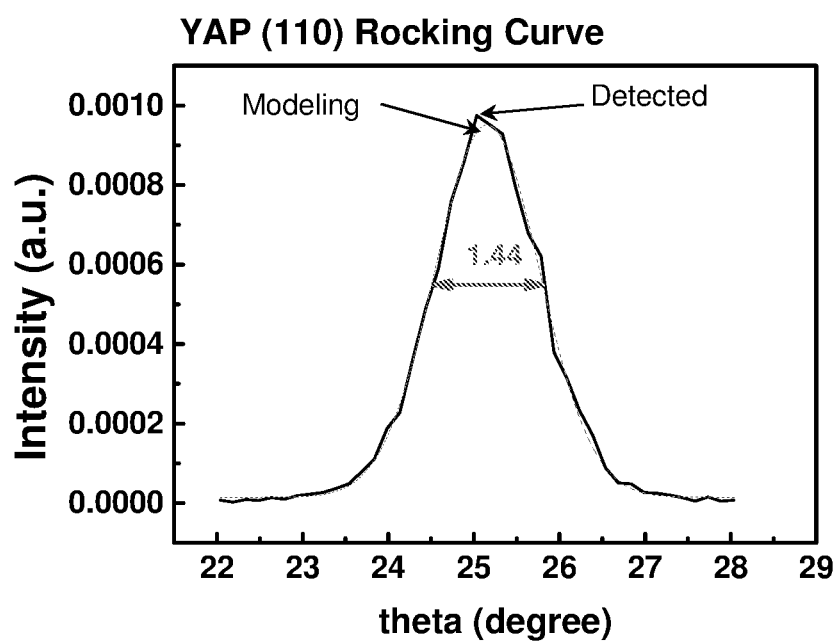
FIG. 12E illustrates a rocking curve across $YAlO_3(110)$ reflection.

FIGS. 11A and 11B illustrate concepts of a normal scan by XRD and an off-normal scan by XRD, respectively, applied to obtain characteristics of the annealed structure 160 formed from the plurality of first layers 130 and the plurality of second layers 140. FIG. 12A illustrates characteristics of the annealed structure 160 formed from the plurality of first layers 130 and the plurality of second layers 140 through a normal scan by XRD, FIG. 12B illustrates a rocking curve across $YAlO_3(004)$ reflection, FIG. 12C illustrates an f-scan across $YAlO_3(012)$ reflection, FIG. 12D illustrates GaAs(20-2) in plane radial scan, and FIG. 12E illustrates a rocking curve across $YAlO_3(110)$ reflection. The results shown in FIGS. 12A and 12B were obtained based on the normal scan concept illustrated in FIG. 11A, and the results shown in FIGS. 12C, 12D, and 12E were obtained on the off-normal scan concept illustrated in FIG. 11B. Referring to FIGS. 12B and 12E, the fitting of rocking curve can be used to determine the crystallinity of the annealed structure 160. The smaller FWHM (full width at half maximum) the rocking curve has, the better crystallinity the formed structure has. The rocking curves perfect matches modeling curves of a Perovskite-type single crystal, confirming that the obtained structure 160 formed from the plurality of first layers 130 and the plurality of second layers 140 manufactured according to the aforementioned method is Perovskite-type single crystal.

Instead of forming one or more pairs of $Y_2O_3$ and $Al_2O_3$ layers by ALD and annealing the stacked $Y_2O_3$ and $Al_2O_3$ layers, $YAlO_3$ having Perovskite structure can be obtained by forming one or more pairs of Al and Y layers and annealing the stacked Al and Y layers in $O_2$ or ozone according to other embodiments. A manufacturing method of $YAlO_3$ having Perovskite structure according to other embodiments is now described with reference to FIGS. 13A and 13B.

Figure 13A:
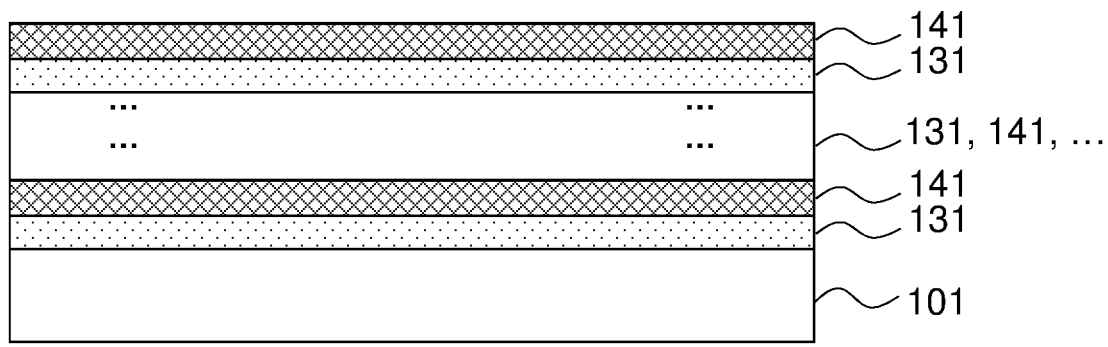
FIGS. 13A and 13B are cross-sectional views illustrating a method for manufacturing a structure having a Perovskite-type single crystal according to other embodiments of the present disclosure.

Referring to FIG. 13A, a plurality of Al layers 131 and a plurality of Y layers 141 are alternately formed on a substrate 101 by ALD or any other suitable processes MBE, MOCVD, and MBD. The substrate 101 may be one of the substrates as described above. Although not shown in FIGS. 13A and 13B, one or more barrier layers may be formed prior to forming the alternately stacked Al and Y layers 131 and 141, and optionally, a protection layer can be formed on the outmost layer of the alternately stacked Al and Y layers 131 and 141.

Figure 13B:
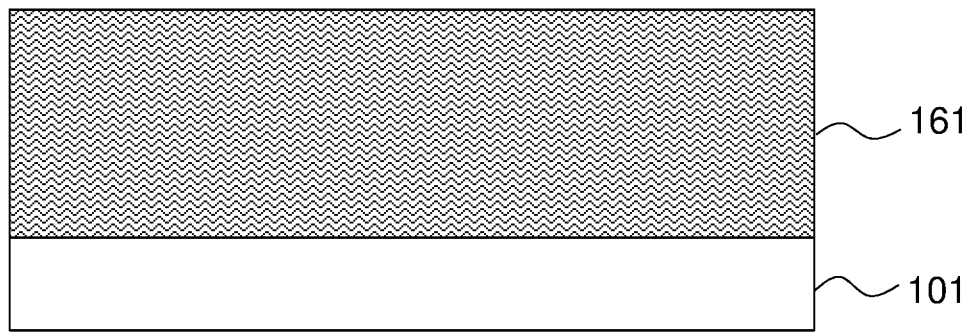

Thereafter, as shown in FIG. 13B, a $YAlO_3$ layer 161 having Perovskite single crystal structure can be obtained by annealing the stacked Al and Y layers in $O_2$ or ozone at an annealing temperature, for example, about 300° C. to about 900° C. for about 2 seconds to about 10 hours. The annealing temperature can be increased from room temperature at a rate, for example, about 50° C./second. According to some embodiments, the annealing process can be performed at the annealing temperature from about 850° C. to about 950° C. for about 2 seconds to about 90 seconds. The annealing can be performed by an annealing chamber or furnace. Alternatively, the annealing can be performed by laser annealing.

As described above, forming a plurality of $Al_2O_3$ layers and a plurality of $Y_2O_3$ layers by ALD and post annealing the $Al_2O_3$ and $Y_2O_3$ layers, or forming a plurality of Al layers and a plurality of Y layers by ALD and post annealing the Al and Y layers oxygen or ozone, to form $YAlO_3$ having a Perovskite single crystal structure is an example, and the present disclosure is not limited to forming $YAlO_3$ having a Perovskite single crystal structure. In some embodiments, each stacked layer is oxide other than $Al_2O_3$ and $Y_2O_3$. In other embodiments, the stacked layers are not necessary to be oxide. The stacked layers can be pure metal other than Y and Al. In this case, the stacked metal layers can be annealed in $O_2$ or ozone such that the metal stacked can be converted to have a Perovskite structure. In other embodiments, the stacked layers can be an alloy such as a MgNi alloy and non-metal material such as C. In this case, the stacked metal layer can be annealed in, for example, He, such that the stacked alloy and non-metal layers can be converted to a composite having a Perovskite structure.

As described above, the method for manufacturing materials having a Perovskite structure includes growing layers by self-limiting reaction deposition method such as atomic layer deposition (ALD) and molecular beam deposition (MBD). Each individual layer may not have a Perovskite structure. After growth, an annealing process may be performed. Duration and temperature of the annealing process depends on the target materials, ranging from about 300° C. up to about 1500° C. The annealing can be alternatively performed by laser annealing. The annealing process can be carried out in air, or those gases with low reactivity such as $N_2$, He, and Ar, or a highly reactive gas such as $O_2$ and ozone.

The above Perovskite materials (or stacked layers) and the method can be implemented to form devices in microelectronic, photovoltaic, photonic, and optoelectronic application. For a photovoltaic application, the device can be a solar cell including the above Perovskite materials (or stacked layers). For an optoelectronic application, the device can be light-emitting diode (LED), photodetector, and diode laser including the above Perovskite materials. According to some embodiments, an nm-thick Perovskite oxide such as $YAlO_3$ has a high dielectric constant (for example, about 30 to about 50) and can be employed as a high k gate dielectric for down-scaling equivalent oxide thickness (EOT) in the high k+ metal gate stack applications. A description of exemplary applications of Perovskite material in microelectronics application is to be given in the following with reference to FIGS. 14A through 15B.

For a microelectronic application, the devices based on a metal-oxide-semiconductor (MOS) structure, such as planar MOSFET, FinFET, and gate all around transistor, may include the above Perovskite materials.

Figure 14A:
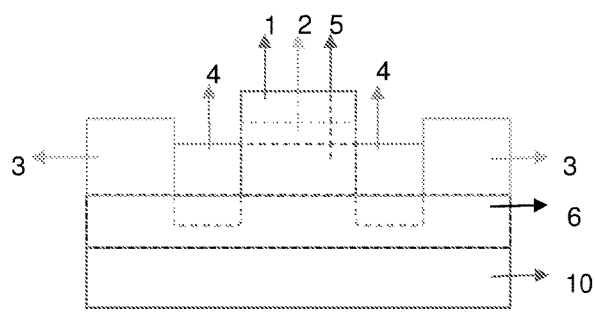
FIGS. 14A-14C respectively illustrate a first cross-sectional view taken along a direction along source and drain regions, a second cross-sectional view taken along a direction perpendicular to the direction along the source and drain regions, and a top view of a transistor, a gate insulating layer of which is implemented by the material having a Perovskite structure according to embodiments of the present disclosure.
Figure 14B:
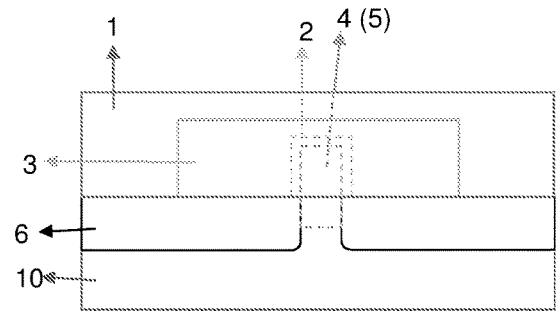
Figure 14C:
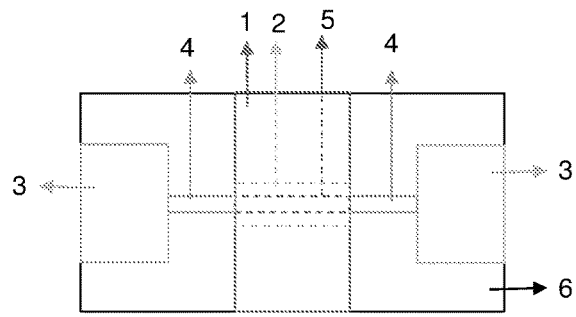
Figure 14D:
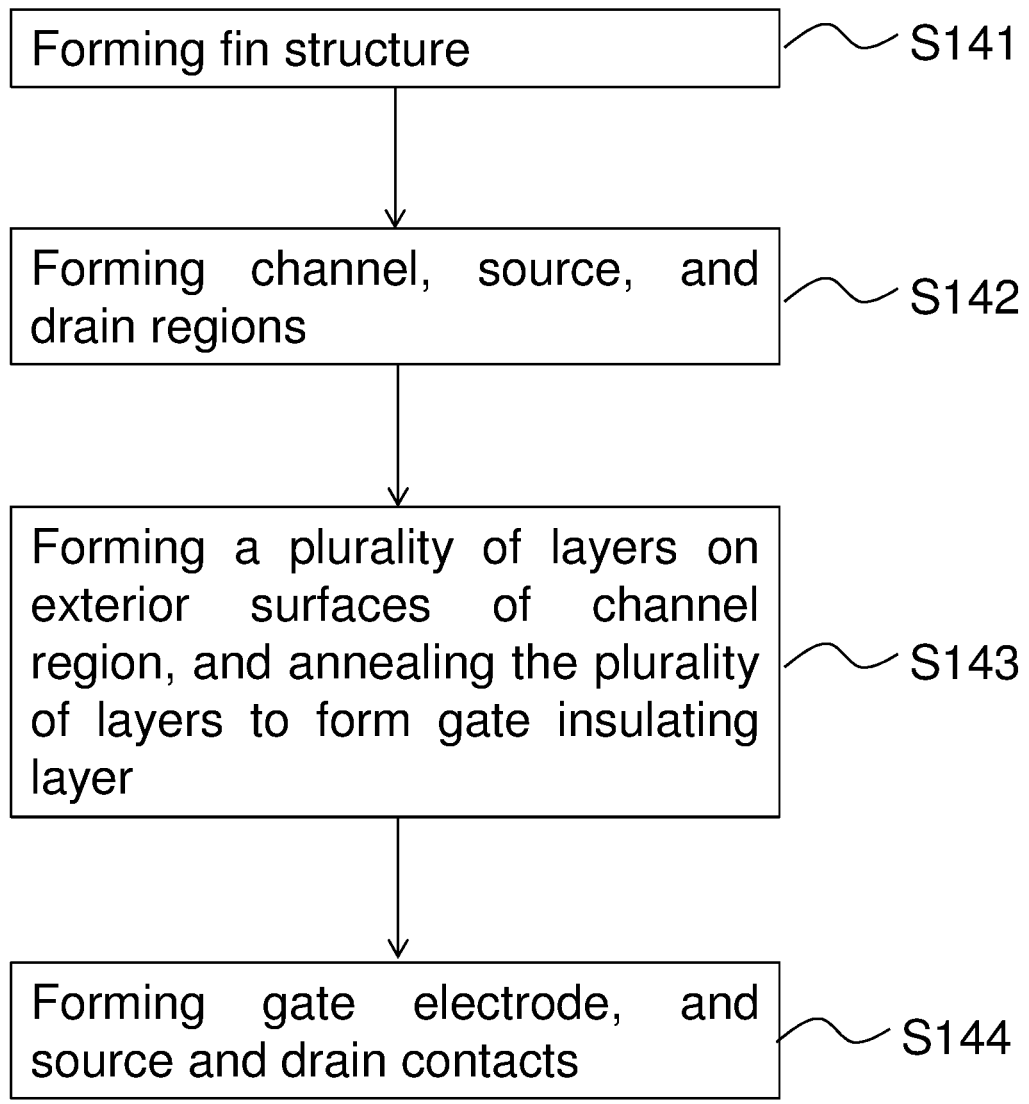
FIG. 14D shows a process flowchart to manufacture the transistor shown in FIGS. 14A-14C.

FIGS. 14A-14C respectively illustrate a first cross-sectional view taken along a direction along source and drain regions, a second cross-sectional view taken along a direction perpendicular to the direction along the source and drain regions, and a top view of a transistor, and FIG. 14D shows a process flowchart to manufacture the transistor shown in FIGS. 14A-14C. A gate insulating layer of the transistor shown in FIGS. 14A-14C is implemented by the material having a Perovskite structure according to embodiments of the present disclosure.

Referring to FIGS. 14A-14C, a transistor is formed on a semiconductor substrate 10 and includes source and drain regions 4, a channel region 5 therebetween, and a gate insulating layer 2 covering portions of the source and drain regions 4 and the channel region 7 and extending continuously therebetween. Source and drain contacts 3 of the transistor are respectively formed onto the source and drain regions 4 which are exposed by the gate insulating layer 2. The transistor further includes a gate electrode layer 1 covering the portion of the gate insulating layer 2 between the source and drain regions 4, and may optionally have a buried oxide layer 6 to reduce leakage current. The gate insulating layer 2 includes a material, such as $YAlO_3$, which has a Perovskite structure and can be manufactured according to embodiments of the present disclosure, and optionally, the gate insulating layer 2 can include a barrier layer (not shown) between the channel region 5 and the material having a Perovskite structure of the gate insulating layer 2 so as to facilitate growth of the material having a Perovskite structure.

With reference to FIGS. 14A-14D, the transistor shown in FIGS. 14A-14C can be manufactured according to the process flowchart shown in FIG. 14D.

A fin structure, together with a shallow trench isolation (not shown), is formed (S141). In a case in which the substrate 10 is a silicon-on-insulator (SOI) substrate, the buried oxide layer 6 can be an insulating layer buried in the SOI substrate and the fin structure can be manufactured by a photolithographing process followed by an etching process to convert a device layer of the SOI substrate to the fin structure, although the present disclosure is not limited thereto.

Alternatively and/or optionally, the substrate 10 can be a Group III-V compound semiconductor including AlN, AlP, AlAs, AlSb, AlBi, GaN, GaP, GaAs, GaSb, GaBi, InN, InP, InAs, InSb, InBi, $Al_xGa_{1-x}As$ (0<x<1), or $In_yGa_{1-y}As$ (0<y<1). In other embodiments, the substrate may be a Group II-VI or a Group IV semiconductor such as Si and Ge. In this case, after forming the buried oxide layer 6, a semiconductor layer, which can be converted into the fin structure by photolithographing and etching processes, can be deposited on the buried oxide layer 6 by an epitaxy process.

Alternatively, the buried oxide layer 6 can be formed by ion implantation, such that a top layer of the substrate 10 after forming the buried oxide layer 6 can be used to form the fin structure by photolithographing and etching processes.

Then, the channel region 5 and the source and drain regions 4 on opposite sides of the channel region 5 are formed from the fin structure by a series of processes including, but not limited to, depositing one or more hard mask layers, photolithographing to define the channel region 5 and the source and drain regions 4, etching the one or more hard masks, and doping ions to respective regions to form the source an drain regions 4 (S142).

Thereafter, a plurality of layers, for example, the aforementioned alternatively stacked first and second layers 130 and 140 or the aforementioned alternatively stacked metal layers 131 and 141, are conformally grown on exterior surfaces of the channel region 5 by, for example, ALD, MBD, and MLD, followed by, for example, the corresponding annealing process described above, such that the gate insulating layer 2 having a Perovskite structure is formed to surround the exterior surfaces of the channel region 5 (S143). Alternatively and/or optionally, one or more barrier layers such as the aforementioned first and second barrier layers 110 and 120 can be formed prior to growing the plurality of layers, and a protection layer such as the aforementioned protection layer 150 can be formed after growing the plurality of layers.

After forming the gate insulating layer 2, the gate electrode 1 covering the gate insulating layer 2 and the source and drain contacts 3 contacting the source and drain regions are formed (S144).

One of ordinary skill in the art should appreciate that the processes for forming the transistor can be modified to have a different sequence. In some embodiments, the gate insulating layer 2 and the gate electrode 1 can be formed prior to forming the source and drain regions 4 and the source and drain contacts 3.

Since the channel region 5 and the source and drain regions 4 are made of a semiconductor fin structure, the transistor shown in FIGS. 14A-14C, manufactured by the process flowchart shown in FIG. 14D, is a fin transistor. The present disclosure, however, is not limited thereto. In other embodiments, the transistor can be another type of transistor, for example, a transistor in which channel, source, and drain regions are made of a top layer of a substrate, rather than a fin structure protruding from a substrate, or a gate-all-around transistor which will be described next.

Figure 15A:
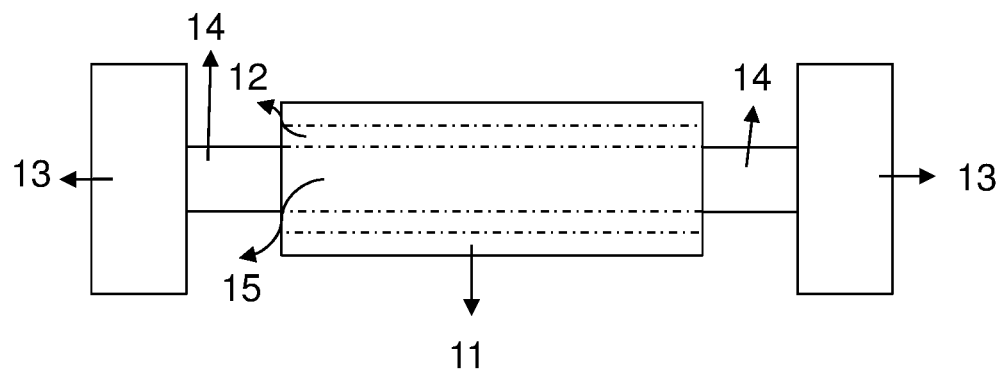
FIGS. 15A and 15B respectively illustrate a cross-sectional view and a top view of a gate-all-around transistor, a gate insulating layer of which is implemented by the material having a Perovskite structure according to embodiments of the present disclosure.
Figure 15B:
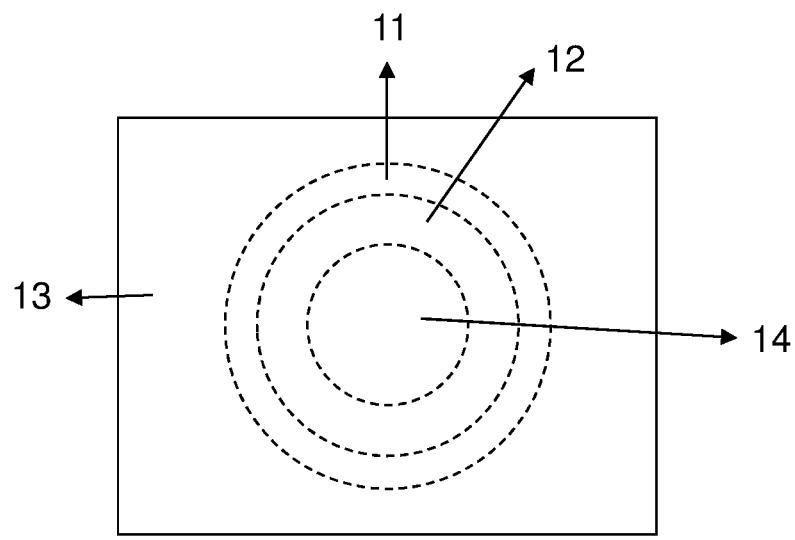

FIGS. 15A and 15B illustrate a cross-sectional view and a top view of a gate-all-around transistor, a gate insulating layer of which is implemented by the material having a Perovskite structure according to embodiments of the present disclosure.

Referring to FIGS. 15 and 15B, the gate-all-around transistor includes source and drain regions 14 and a gate insulating layer 12 extending between the source and drain regions 14 and surrounding the portion therebetween. Source and drain electrodes 13 of the gate-all-around transistor are formed onto the source and drain regions 14, respectively. The transistor further includes a gate electrode 11 covering the gate insulating layer 12. The gate insulating layer 12 is a material, such as $YAlO_3$, which has a Perovskite structure and can be manufactured according to embodiments of the present disclosure.

In some embodiments, a thickness of $YAlO_3$ having a Perovskite structure can be about 1 nm and a dielectric constant of $YAlO_3$ having a Perovskite structure can be about 30 to about 50. Thus, down-scaling equivalent oxide thickness (EOT) can be realized in an integrated circuits implemented by thousands of to millions of or more transistors having $YAlO_3$ having a Perovskite structure serving as gate insulating layers. In addition, the $YAlO_3$ having a Perovskite structure exhibits excellent semiconductor interface with reduced defects thereof comparing to contemporary gate insulating layers, and thus, the performance of the transistors can be also improved.

A method for manufacturing the gate-all-around transistor can be referred to the process flowchart shown in FIG. 14D, and a description of the method for manufacturing the gate-all-around transistor will be omitted here for avoid redundancy.

As described above, a high-quality interface with a semiconductor substrate or a semiconductor layer and excellent stability of Perovskite materials can be achieved according to embodiments of the present disclosure. Moreover, the method for manufacturing the material having a Perovskite single crystal structure according to various embodiments is compatible to the contemporary commercial electronics manufacturing platforms such as GaN, InGaAs, and Si based devices, facilitating in manufacturing new generation of electronics.

The stacked multilayers having a Perovskite structure formed by self-limiting reaction deposition and post annealing as described above have excellent crystallinity, excellent uniformity, excellent chemical homogeneity, and excellent interface quality. Precise composition control is available to control the thickness of the multilayers (or stacked layer) by self-limiting reaction deposition. In addition, the self-limiting reaction deposition method requires lower crystallizing temperatures and allows the stacked layers to be formed in flat and non-flat surfaces.

According to one aspect of the present disclosure, a method includes alternately growing, on a substrate, each of a plurality of first layers and each of a plurality of second layers having compositions different from the plurality of first layers and forming a material having a Perovskite single crystal structure by annealing the plurality of first layers and the plurality of second layers.

According to one aspect of the present disclosure, a method includes alternately growing a plurality of first layers and a plurality of second layers by self-limiting reaction deposition and forming a material having a Perovskite single crystal structure by annealing the plurality of first layers and the plurality of second layers. A thickness of each first layer and a thickness of each second layer satisfy $$\frac{t1 \times A \times \rho 1}{M1} : \frac{t2 \times A \times \rho 2}{M2} = 1:1,$$

in which A is a deposition area, $\rho 1$ and $\rho 2$ are densities of the plurality of first layers and the plurality of second layers, respectively, and M1 and M2 are molar masses of materials constituting the plurality of first layers and the plurality of second layers, respectively.

According to one aspect of the present disclosure, a method for manufacturing a transistor includes forming source and drain regions, alternately growing, on a channel region between the source and drain regions, each of a plurality of first layers and each of a plurality of second layers having compositions different from the plurality of first layers, forming a gate insulating layer having a Perovskite single crystal structure by annealing the plurality of first layers and the plurality of second layers, and forming a gate electrode covering the gate insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a transistor, the method comprising:
    forming source and drain regions;
    alternately growing, on a channel region disposed between the source and drain regions, each of a plurality of first layers and each of a plurality of second layers having compositions different from the plurality of first layers;
    forming a gate insulating layer having a Perovskite single crystal structure by annealing the plurality of first layers and the plurality of second layers to convert the plurality of first layers and the plurality of second layers alternately stacked on each other to a material having a Perovskite single crystal structure containing elements of the plurality of first layers and the plurality of second layers; and
    forming a gate electrode covering the gate insulating layer.

2. The method of claim 1, wherein the annealing is performed in a temperature range from about 300° C. to about 1500° C.

3. The method of claim 1, wherein the gate insulating layer includes materials having a chemical formula $ABX_3$, in which:
    A is a rare earth element selected from the group consisting of Sc, Y, La, Ce, Pr, Nd, Pm, Sm, Eu, Gd, Tb, Dy, Ho, Er, Tm, Yb, and Lu, or A is an alkaline earth element selected from the group consisting of Be, Mg, Ca, Sr, and Ba, or A is organic compound $CH_3NH_3$,
    B is a non-rare earth element selected from the group consisting of Ti, Zr, Hf, Al, Ga, In, Tl, Ge, Sn, and Pb, or B is a rare-earth element or a transition metal, and
    X is a nonmetal element selected from the group consisting of O, S, Se, Te, F, Cl, Br, I, and At.

4. The method of claim 1, wherein alternately growing each of the plurality of first layers and each of the plurality of second layers is performed by self-limiting reaction.

5. The method of claim 1, wherein alternately growing each of the plurality of first layers and each of the plurality of second layers is performed by one of atomic layer deposition (ALD) and molecular beam deposition (MBD).

6. The method of claim 1, wherein the annealing is performed in air, $N_2$, He, Ar, or a reactive gas including $O_2$ or ozone.

7. A method, comprising:
    forming a fin structure over a substrate;
    forming a channel region in the fin structure;
    forming source and drain regions on opposing sides of the channel region in the fin structure;
    growing each of a plurality of first layers and each of a plurality of second layers directly alternating with each other over the channel region, the plurality of first layers having same first compositions and the plurality of second layers having same second compositions different from the first compositions;
    converting the plurality of first layers and the plurality of second layers alternately stacked on each other to a gate insulating layer made of a material having a Perovskite single crystal structure containing elements of the plurality of first layers and the plurality of second layers by annealing the plurality of first layers and the plurality of second layers; and forming a gate electrode layer over the gate insulating layer made of a material having a Perovskite single crystal structure.

8. The method of claim 7, wherein the substrate is one selected from the group consisting of a Group III-V compound semiconductor selected from the group consisting of AlN, AlP, AlAs, AlSb, AlBi, GaN, GaP, GaAs, GaSb, GaBi, InN, InP, InAs, InSb, InBi, $Al_xGa_{1-x}As$ (0<x<1), and $In_yGa_{1-y}As$ (0<y<1), one of Group II-VI or Group IV semiconductors including Si and Ge, and one of Perovskite materials including $LaAlO_3$ and $SrTiO_3$.

9. The method of claim 7, wherein alternately growing each of the plurality of first layers and each of the plurality of second layers is performed by self-limiting reaction.

10. The method of claim 7, wherein alternatively growing each of the plurality of first layers and each of the plurality of second layers is performed by one of atomic layer deposition (ALD) and molecular beam deposition (MBD).

11. The method of claim 7, wherein the annealing is performed in a temperature range from about 300° C. to about 1500° C.

12. The method of claim 7, wherein the annealing is performed in air, $N_2$, He, Ar, or a reactive gas including $O_2$ or ozone.

13. The method of claim 7, wherein the substrate is an n-GaAs(111)A substrate.

14. The method of claim 7, further comprising forming a GaAs(111) epi-layer prior to alternately growing each of the plurality of first layers and each of the plurality of second layers.

15. The method of claim 7, wherein the material having a Perovskite single crystal structure include materials having a chemical formula $ABX_3$, in which:

A is a rare earth element selected from the group consisting of Sc, Y, La, Ce, Pr, Nd, Pm, Sm, Eu, Gd, Tb, Dy, Ho, Er, Tm, Yb, and Lu, or A is an alkaline earth element selected from the group consisting of Be, Mg, Ca, Sr, and Ba, or A is organic compound $CH_3NH_3$, B is a non-rare earth element selected from the group consisting of Ti, Zr, Hf, Al, Ga, In, Tl, Ge, Sn, and Pb, or B is a rare-earth element or a transition metal, and X is a nonmetal element selected from the group consisting of O, S, Se, Te, F, Cl, Br, I, and At.

16. A method, comprising:
forming a fin structure over a substrate,
wherein the substrate is one selected from the group consisting of a Group III-V compound semiconductor selected from the group consisting of AN, AlP, AlAs, AlSb, AlBi, GaN, GaP, GaAs, GaSb, GaBi, InN, InP, InAs, InSb, InBi, $Al_xGa_{1-x}As$ (0<x<1), and $In_yGa_{1-y}As$ (0<y<1), one of Group II-VI or Group IV semiconductors including Si and Ge, and one of Perovskite materials including $LaAl_3$ and $SrTiO_3$;
forming a channel region in the fin structure;
forming source and drain regions on opposing sides of the channel region in the fin structure;
alternately growing, over the channel region, a plurality of first metal layers made of a first metal and a plurality of second metal layers made of a second metal, by one of atomic layer deposition (ALD) and molecular beam deposition (MBD),
wherein the second metal is different from the first metal;
forming a metal oxide gate insulating layer comprising the first and second metals having a Perovskite single crystal structure by annealing the plurality of first metal layers and the plurality of second metal layers in an ozone or $O_2$ environment; and
forming a gate electrode layer over the metal oxide gate insulating layer.

17. The method of claim 16, wherein each of the plurality of first metal layers includes Al and each of the plurality of second metal layers includes Y, or each of the plurality of first metal layers includes Y and each of the plurality of second metal layers includes Al.

18. The method of claim 16, wherein the alternatively growing each of the plurality of first metal layers and each of the plurality of second metal layers comprises alternately growing $Al_2O_3$ layers and $Y_2O_3$ layers.

19. The method of claim 18, wherein a ratio of a thickness of an $Al_2O_3$ layer and a thickness of a $Y_2O_3$ layer is about 1:1.77.

20. The method of claim 16, wherein the annealing is performed at about 300° C. to about 900° C. for about 10 seconds to about 2 hours in a He environment.

* * * * *